United States Patent
Oshima (10) Patent No.: US 8,180,951 B2
(45) Date of Patent: May 15, 2012

(54) MEMORY SYSTEM AND METHOD OF CONTROLLING THE MEMORY SYSTEM

(75) Inventor: Takashi Oshima, Chiba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 422 days.

(21) Appl. No.: 11/687,087

(22) Filed: Mar. 16, 2007

(65) Prior Publication Data

US 2007/0220216 A1    Sep. 20, 2007

(30) Foreign Application Priority Data

Mar. 16, 2006 (JP) ................................ 2006-072956

(51) Int. Cl.
*G06F 12/00* (2006.01)
(52) U.S. Cl. .. 711/103; 711/104; 711/202; 711/E12.004
(58) Field of Classification Search .................. None
See application file for complete search history.

(56) References Cited

U.S. PATENT DOCUMENTS

| | | | |
|---|---|---|---|
| 5,488,583 A * | 1/1996 | Ong et al. ............. | 365/201 |
| 5,887,151 A * | 3/1999 | Raz et al. ............. | 712/206 |
| 5,943,693 A * | 8/1999 | Barth ................... | 711/220 |
| 6,434,676 B1 * | 8/2002 | Perloff ................. | 711/154 |
| 7,061,812 B2 | 6/2006 | Shinagawa et al. | |
| 2005/0268026 A1 | 12/2005 | Oshima | |

FOREIGN PATENT DOCUMENTS

| | | |
|---|---|---|
| JP | 7-122088 | 5/1995 |
| JP | 2001-35172 | 2/2001 |
| JP | 2001-229073 | 8/2001 |
| JP | 2004-303278 | 10/2004 |
| JP | 2005-107599 | 4/2005 |
| JP | 2005-222534 | 8/2005 |

OTHER PUBLICATIONS

Japanese Office Action mailed on May 31, 2011 in the counterpart Japanese application 2006-072956 filed on May 16, 2007 with English translation.
Japanese Office Action with English translation mailed on Feb. 21, 2012 in corresponding application JP2006-072956 filed on Mar. 16, 2006.

* cited by examiner

*Primary Examiner* — Reginald Bragdon
*Assistant Examiner* — Thanh Vo
(74) *Attorney, Agent, or Firm* — Oblon, Spivak, McClelland, Maier & Neustadt, L.L.P.

(57) ABSTRACT

A memory system for transmitting data to and receiving data from a host apparatus includes a semiconductor memory and an access-controlling part. The semiconductor memory has storage areas identified by physical addresses, stores data in each of the storage areas, performs data write in accordance with a request made by the host apparatus. The access-controlling part selects a recommended address, which is recommended to be used in a next data write, on the basis of operation information about a factor that influences time consumed for data write in the semiconductor memory, and outputs the recommended address to the host apparatus.

18 Claims, 9 Drawing Sheets

| Signal | Content |
|---|---|
| CLE | Command-latch enable |
| -CE | Chip enable |
| -WE | Write enable |
| ALE | Address-latch enable |
| -RE | Read enable |
| DATA | Command, address, data |
| R/-B | Ready/busy output |
| -WP | Write protect |

| Lower page | Upper page | Lower page | Upper page |
|---|---|---|---|
| 0 | 4 | ⋮ | ⋮ |
| 1 | 5 | ⋮ | ⋮ |
| 2 | 8 | ⋮ | ⋮ |
| 3 | 9 | 95 | 102 |
| 6 | 12 | 98 | 104 |
| 7 | 13 | 99 | 105 |
| 10 | 16 | 102 | 108 |
| 11 | 17 | 103 | 109 |
| 14 | 20 | 106 | 112 |
| 15 | 21 | 107 | 113 |
| 18 | 24 | 110 | 116 |
| 19 | 25 | 111 | 117 |
| 22 | 28 | 114 | 120 |
| 23 | 29 | 115 | 121 |
| 26 | 32 | 118 | 124 |
| ⋮ | ⋮ | 119 | 125 |
| ⋮ | ⋮ | 122 | 126 |
| ⋮ | ⋮ | 123 | 127 |

MEMORY SYSTEM AND METHOD OF CONTROLLING THE MEMORY SYSTEM

CROSS-REFERENCE TO RELATED APPLICATIONS

This application is based upon and claims the benefit of priority from prior Japanese Patent Application No. 2006-072956, filed Mar. 16, 2006, the entire contents of which are incorporated herein by reference.

BACKGROUND OF THE INVENTION

1. Field of the Invention

The present invention relates to a memory system that transmits data to and receives data from a host apparatus and a method of controlling the memory system.

2. Description of the Related Art

A semiconductor memory such as a NAND-type flash memory, from and into which some data items of a predetermined size can be read and written, may be incorporated in a memory card that is to be connected to a host apparatus (See, for example, Jpn. Pat. Appln. KOKAI Publication No. 7-122088.). In such a semiconductor memory, the process time in response to an access may vary in accordance with the address of the memory to which the host apparatus accesses. The "process time" in response to an access is the time required to write or read data into or from the semiconductor memory.

In the NAND-type flash memory, data can be erased only in units of blocks. One block includes a plurality of pages, each of which constitutes a write unit. Hence, rewriting only a part of data stored in a block requires writing the new data, which is to replace that part of the data stored in the block, into a new block. Then, part of the old block which is not rewritten is copied into the new block, from the old block that includes the old data (i.e., data to be rewritten). Many copy operation for data items not to be written will greatly increase the overhead in the data-rewriting process.

On the other hand, rewriting all data stored in a block does not need copy of the part of data which is not to be rewritten from the old block into the new block and attains faster access than the rewriting only a part of the data stored in a block.

As mentioned above, the access speed changes in accordance with the address that is accessed, resulting in possible fluctuation of the process time of the memory in response to an access. As a result, the performance of the memory card deteriorates depending on the address that the host apparatus accesses.

BRIEF SUMMARY OF THE INVENTION

According to one aspect of the present invention, there is provided a memory system for transmitting data to and receiving data from a host apparatus, comprising: a semiconductor memory having storage areas identified by physical addresses, storing data in each of the storage areas, performing data write in accordance with a request made by the host apparatus; and an access-controlling part selecting a recommended address, which is recommended to be used in a next data write, on the basis of operation information about a factor that influences time consumed for data write in the semiconductor memory, and outputting the recommended address to the host apparatus.

According to one aspect of the present invention, there is provided a memory system for transmitting data to and receiving data from a host apparatus, comprising: a semiconductor memory having storage areas identified by physical addresses, storing data in each of the storage areas, performing data write in accordance with a request made by the host apparatus; an access-controlling part selecting a recommended address, which is recommended to be used in a next data write, on the basis of operation information about a factor that influences time consumed for data write in the semiconductor memory, and outputting the recommended address to the host apparatus; and a controller receiving write data from the host apparatus, temporarily storing the write data, receiving the recommended address, and outputting the write data which has the recommended address to the semiconductor memory.

According to one aspect of the present invention, there is provided a method of controlling a memory system which is configured to transmit data to and receive data from a host apparatus and has a semiconductor memory, the semiconductor memory having storage areas identified by physical addresses, storing each data in each of the storage areas, performing data write in accordance with a request made by the host apparatus, the method comprising: reading from the memory system a recommended address, which is recommended to be used in a next data write, on the basis of operation information about a factor that influences time consumed for data write in the semiconductor memory, and outputting the recommended address to the host apparatus; and instructing the semiconductor memory to write data which is allocated with the recommended address.

DETAILED DESCRIPTION OF THE INVENTION

The first and second embodiments of the present invention will be described, with reference to the accompanying drawing. The components shown in each drawing, which are identical or similar to those shown in any other drawing, are designated by the same reference numbers. The first and second embodiments, which will be described hereinafter, are exemplary apparatuses or methods embodying the present invention. Thus, the technical concept of the present invention is not limited to the structures and arrangements of the components described below. Further, the technical concept of the present invention can add various changes and modifications to what is defined by the claims appended hereto.

A memory card, which is an example of a memory system according to an embodiment of this invention, will be described below.

First Embodiment

Figure 1:
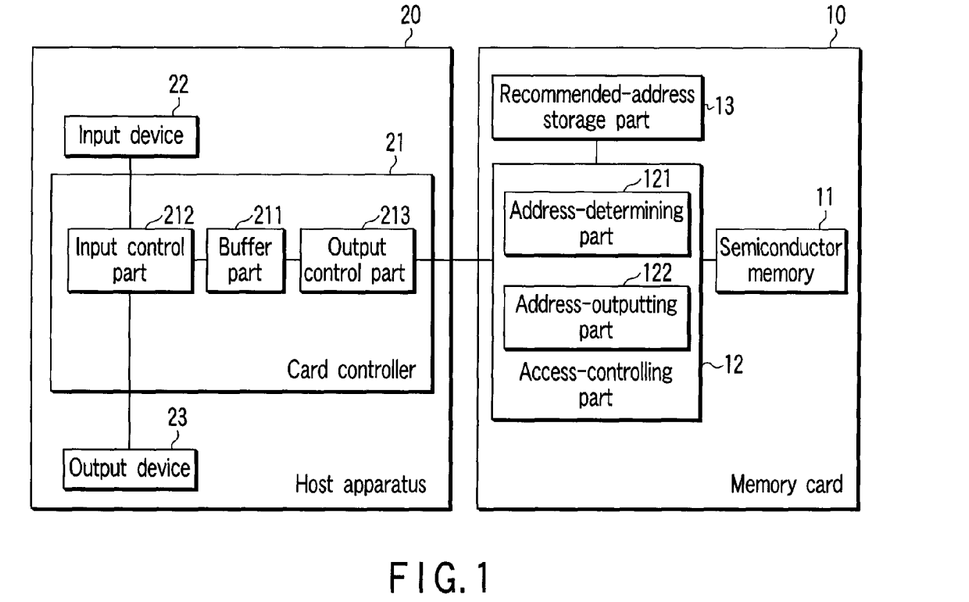
FIG. 1 schematically shows the configuration of a memory card according to a first embodiment of the present invention.

As shown in FIG. 1, the memory card according to the first embodiment of this invention is a memory card 10 that can transmit data to and receive from a host apparatus 20. The memory card 10 comprises a semiconductor memory 11 and an access control part 12. The semiconductor memory 11 can be accessed from the host apparatus 20. The access control part 12 determines a recommended address to be accessed, from the operation information about the memory card 10. The recommended address thus determined is output to the host apparatus 20. Data to which the recommended address is allocated is read from, or written into, the semiconductor memory 11. Data to which the recommended address is allocated can be written faster than data with any other addresses at the time certain data writing is completed. The "operation information" represents a factor that influences the process time in response to an access to the semiconductor memory 11, such as the data-storage state or the functions of the semiconductor memory 11.

The access control part 12 comprises an address-determining part 121 and an address-outputting part 122. The address-determining part 121 monitors the condition of the semiconductor memory 11, thereby determining a recommended address that the host apparatus is advised to use to access the semiconductor memory 11. The address-outputting part 122 outputs the recommended address to the host apparatus 20. The memory card 10 further comprises a recommended-address storage part 13 that can store a plurality of recommended addresses.

Figure 2:
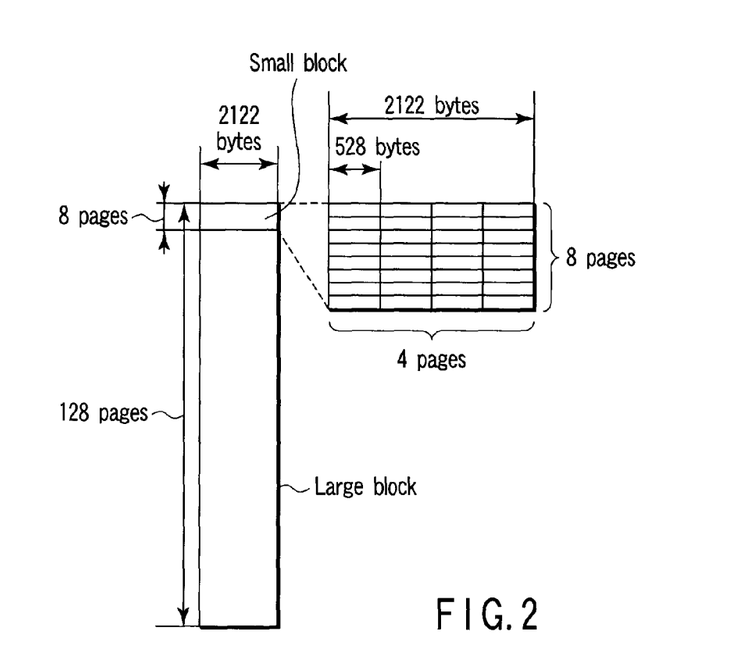
FIG. 2 is a schematic representation of a structure that a semiconductor memory according to the first embodiment may have.

A specific logic block-address (LBA) is assigned to a block (hereinafter referred to as "small block") that is composed of a plurality of data items of a predetermined size. In the memory card 10, data is read and written from and into the semiconductor memory 11 in the LBA order in units of small blocks. The small blocks are stored in a block (hereinafter referred to as "large block") of a predetermined size in the semiconductor memory 11. In the scheme where the small blocks should be stored in the large block in the LBA order, storing small blocks with non-sequential LBAs involves moving small blocks stored in the large block in order to store small blocks in a large block in the LBA order. FIG. 2 shows exemplar small blocks and large blocks. As FIG. 2 shows, a small block is comprised of data for 4×8 pages, each being 528 bytes. As FIG. 2 shows, too, a large block is comprised of 2112 bytes×128 pages and can therefore store 16 small blocks, each being 2112 bytes (4 pages)×8 pages.

The process of rearranging small blocks in a large block so that the small blocks may be stored in the LBA order will be called "re-storing" hereinafter. When the re-storing is performed, the time required to write data will increase. In other words, the process speed (access speed) of the memory will decrease when the memory operates in response to an access the host apparatus 20 has made.

Writing Small blocks having sequential LBAs into a large block does not require re-stored. Such small blocks are only needed to be "sequentially added (incrementally written)" in a vacant area in a large block. Hence, the access speed for writing small blocks with sequential LBAs is higher than that for writing small blocks with non-sequential LBAs. To "sequentially add (incrementally write) the small blocks" represents writing small blocks in a large block without performing the re-storing of small blocks.

The size of a block, which corresponds to the erase unit in the semiconductor memory 11 and hereinafter referred to as "erase-block size", is equal to the size of the large block. The semiconductor memory 11 can be, for example, a NAND-type flash memory A method of writing data into the semiconductor memory 11 shown in FIG. 1 will be explained with reference to FIGS. 3 to 6. In FIGS. 3 to 6, the small block LBA00$h$, for example, is a small block allocated with LBA"00$h$".

Figure 3:
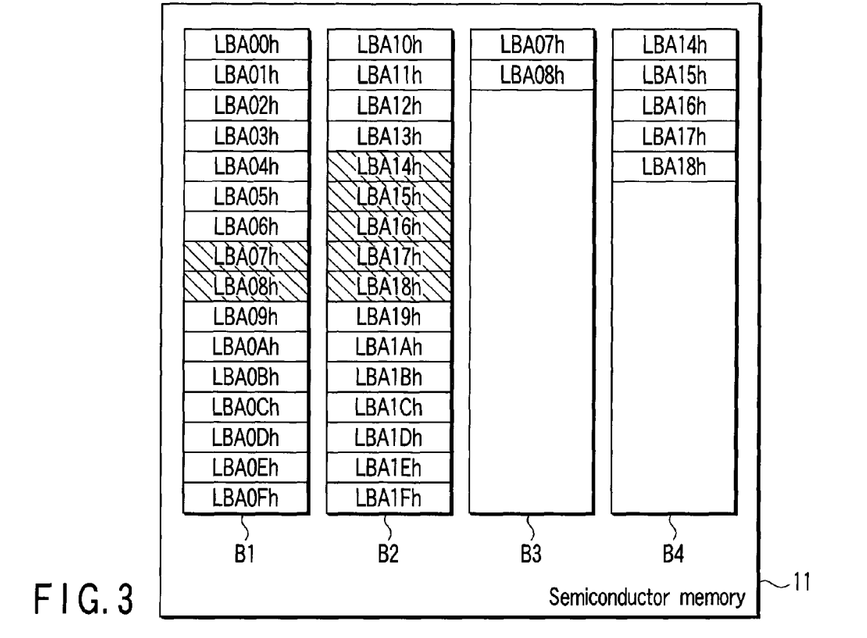
FIGS. 3 to 6 schematically show a method of storing data by the semiconductor memory according to the first embodiment.

As shown in FIG. 3, small blocks LBA00$h$ to LBA0F$h$ are stored in the large block B1. Small blocks LBA10$h$ to LBA1F$h$ are stored in the large block B2. The small blocks LBA07$h$ and LBA08$h$ and the small blocks LBA14$h$ to LBA18$h$ are hatched in FIG. 3. This means small blocks identical in LBA to hatched small blocks have been written elsewhere in the semiconductor memory 11. More precisely, small blocks LBA07$h$ to LBA08$h$ are stored in the large block B3, and small blocks LBA14$h$ to LBA18$h$ are stored in the large block B4. The small blocks LBA07$h$ and LBA08$h$ stored in the large block B1 and the small blocks LBA14$h$ to LBA18$h$ stored in the large block B2 can be erased because they are not used. Nevertheless, the small blocks LBA07$h$ and LBA08$h$ and the small blocks LBA14$h$ to LBA18$h$ stored in the large blocks B1 and B2, respectively, are not erased to remain in the semiconductor memory 11 because the data is erased in units of large blocks in the semiconductor memory 11. Hereinafter, any large blocks that cannot hold new small blocks written, such as block B1 and block B2, will be referred to as "old assign blocks". On the other hand, any large blocks that can hold new small blocks written, such as block B3 and block B4, will be referred to as "new assign blocks".

Figure 4:
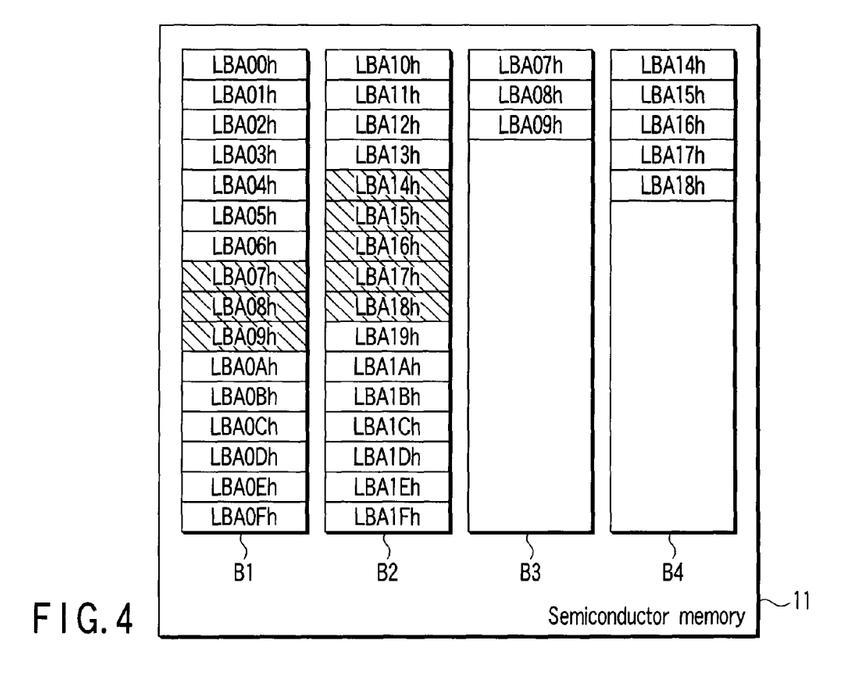

FIG. 4 shows the semiconductor memory 11 that stores a new small block LBA09$h$ in addition to those already stored as shown in FIG. 3. Since small blocks are to be stored in a large block in the LBA order, the small block LBA09$h$ written anew is stored next to the small block LBA08$h$ stored in the large block B3.

Figure 5:
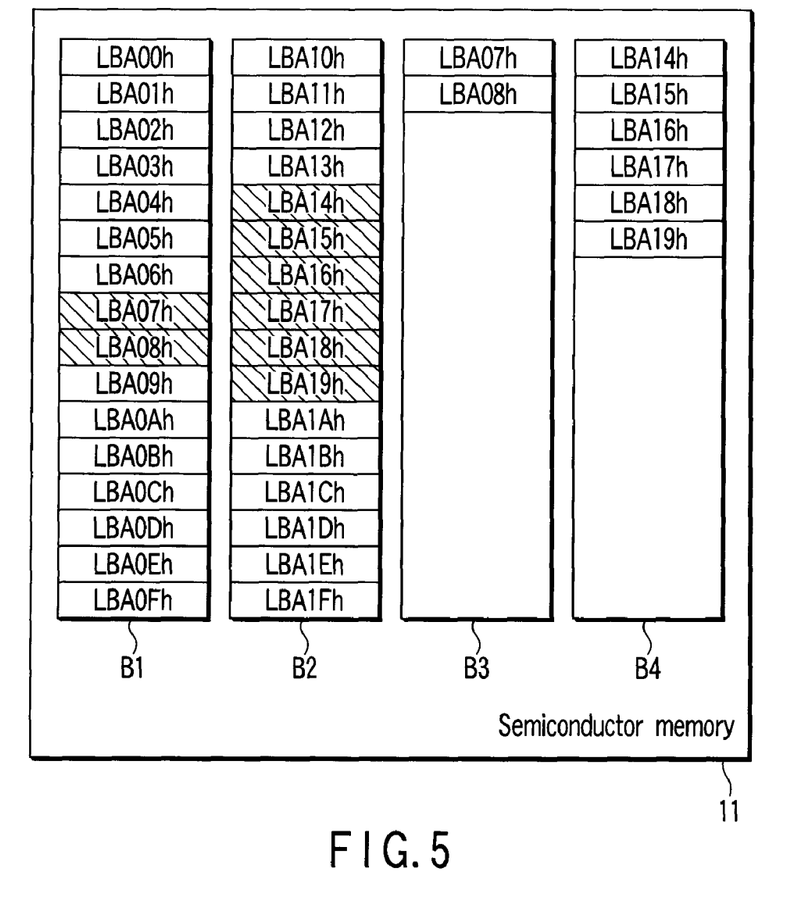

FIG. 5 shows the semiconductor memory 11 that stores a new small block LBA19$h$ in addition to those already stored as shown in FIG. 3. The small block LBA19$h$ written anew is stored next to the small block LBA18$h$ stored in the large block B4.

Figure 6:
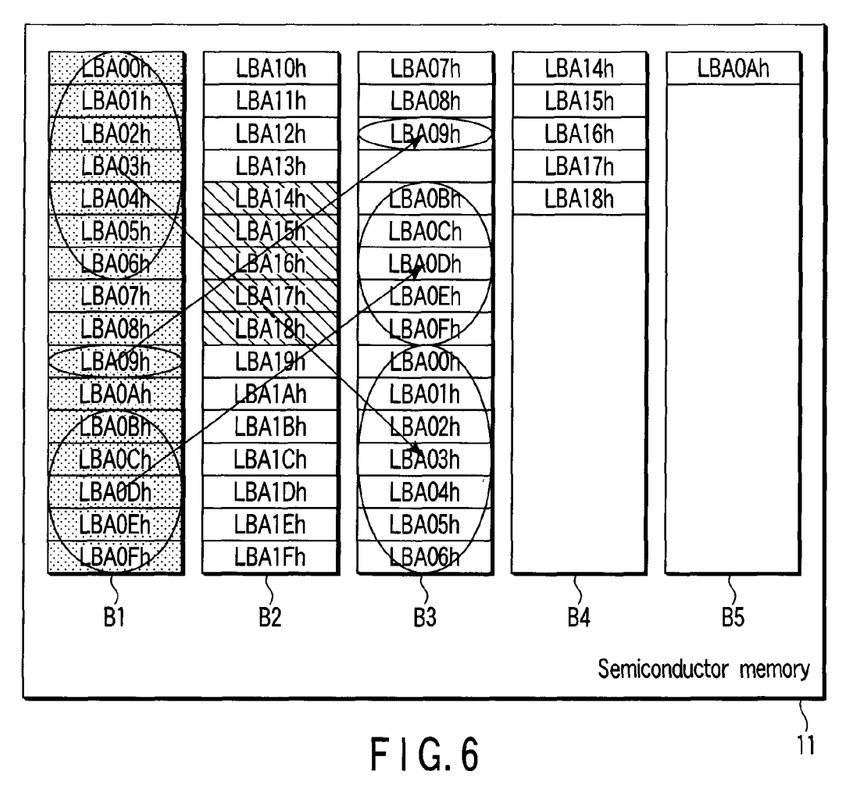

FIG. 6 shows the semiconductor memory 11 that stores a new small block LBA0A$h$ in the large block B5, in addition to those already stored as shown in FIG. 3. The small block LBA0A$h$ is continuous to neither the small block LBA08$h$ stored in the large block B3 nor the small block LBA18$h$ stored in the large block B4. Therefore, a large block B5 is set as a new assign block as shown in FIG. 6, and the small block LBA0Ah written anew is stored at the head of the large block B5.

If new large blocks are infinitely set, many storage areas will be wasted in the semiconductor memory 11. Therefore, some restriction is imposed in most cases, so that large blocks may not infinitely set. For example, the restriction which keeps number of new assign blocks smaller than that of the old assign blocks may be imposed. Under the restriction, the small block LBA0Ah is re-stored as is illustrated in FIG. 6. More specifically, the small block LBA09h stored in the large block B1 is stored next to the small block LBA08h stored in the large block B3. Then, the small blocks LBA0Bh to LBA0Fh stored in the large block B1 are stored into the large block B3. Next, the small blocks LBA00h to LBA06h stored in the large block B1 are stored into the large block B3. Since the small block LBA0Ah written anew is stored in the large block B5, the small block LBA0Ah stored in the large block B1 is not re-stored. Thereafter, the large block B1 is erased. As a result, the number of the new assign blocks becomes equal to that of the old assign blocks. The re-storing of small blocks can reduce the waste of storage areas in the semiconductor memory 11.

When small blocks with non-sequential LBAs are written as shown in FIG. 6, re-stored is performed. Hence, it takes longer to write such small blocks than to write small blocks with sequential LBAs as shown in FIGS. 4 and 5. Thus, the time required to write data into the semiconductor memory 11 varies in accordance with the data-storage state of the semiconductor memory 11 and the small blocks LBAs written in the memory 11.

The host apparatus 20 shown in FIG. 1 may be, for example, a personal computer or a digital camera. It can be connected to the memory card 10.

As mentioned above, data is erased in units of large blocks in the semiconductor memory 11.

Nevertheless, the host apparatus 20 accesses the memory card 10 with recognition that data is erased in units of small blocks in the semiconductor memory 11. Assume that small blocks may have, for example, a size of 16 kB. Then, the host apparatus 20 allocates logical addresses and physical addresses to 16-kB data items. Each logical block address (LBA) is an address that the file system, which may be provided in the host apparatus 20, allocates to a data item of the small-block size. Each physical block address is an address that the driver software, which may be provided in the host apparatus 20, allocates to the data item of the small-block size.

The host apparatus 20 outputs write commands to the memory card 10, for example, to write data in non-sequential manner in small block units each of which are allocated with a physical block address. The memory card 10 acquires not only the data of the small data blocks and the physical block addresses, but also the small-block logical addresses added to the small blocks. In the memory card 10, the small blocks are stored in the large blocks such that the logic block addresses of the small blocks are sequential as described above. As a result, the process of rewriting only a part of the data stored in each large block can be reduced.

The host apparatus 20 comprises a card controller 21, an input device 22, and an output device 23. The card controller 21 comprises a buffer part 211, an input control part 212, and an output control part 213. The input control part 212 stores the data transferred from the input device 22, such as the charge-coupled device (CCD) or microphone provided in digital camera, into the buffer part 221. The data read from the buffer part 211 via the output device 23 is transferred to a computer or the like (not shown).

The buffer part 211 stores data in units of small blocks. LBAs are allocated to the small blocks stored in the buffer part 211. The LBAs are used to designate data when the semiconductor memory 11 is accessed.

The output control part 213 controls the data transfer between the buffer part 211 and the memory card 10. More precisely, the output control part 213 receives a recommended address from the address-outputting part 122. Based on the recommended address, the output control part 213 selects the small block stored in the buffer part 211 and allocated with the recommended address, as a small block that will be used to access the semiconductor memory 11. Then, the output control part 213 reads the small block thus selected, from the buffer part 211. This small block is transferred to the memory card 10. The output control part 213 stores small blocks read from the memory card 10, into the buffer part 211.

Figure 7:
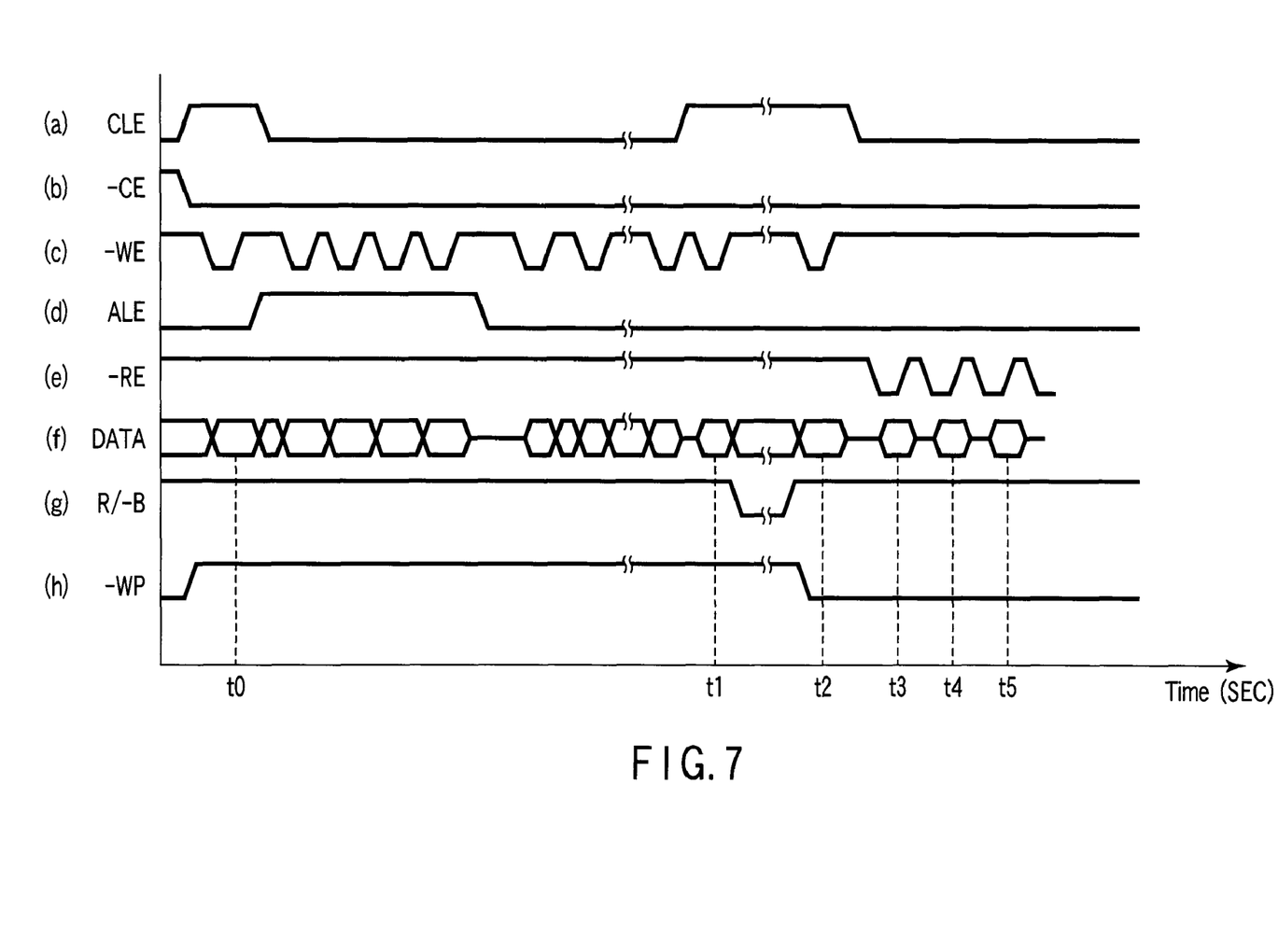
FIG. 7 is a timing chart illustrating an operating mode of the memory card according to the first embodiment.
Figure 8:
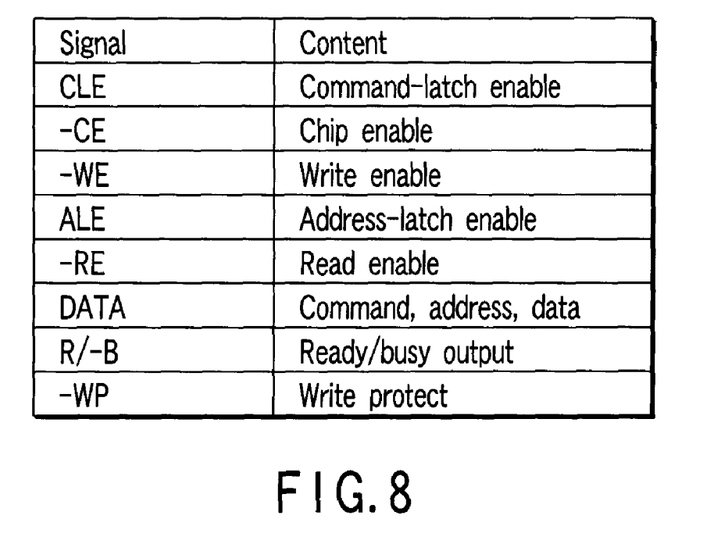
FIG. 8 is a table explaining various signals used in the semiconductor memory according to the first embodiment.

How the memory card system comprising the memory card 10 and the host apparatus 20, both shown in FIG. 1, operates will be explained with reference to the timing chart of FIG. 7. The timing chart of FIG. 7 explains how the system operates if the memory card 10 has an interface identical to that of an NAND-type flash memory. The signals shown in the timing chart of FIG. 7 are control signals and the like for controlling the NAND-type flash memory shown in FIG. 8. Signal "DATA" shown in FIG. 8 represents the commands, addresses and data that are transferred between the memory card 10 and the host apparatus 20. Signal "DATA" is combined with signal "CLE", "–WE", "ALE" and "–RE", to distinguish a command, an address and data from one another. Signal "–CE" indicates an access to the memory card 10. Signal "R/–B" indicates the internal state of the memory card 10. Signal "–WP" inhibits data-writing into the memory card 10. Any signal with the sign "–" is valid at low level. Any signal with no sign "–" is valid at high level.

At time t0 shown in the timing chart of FIG. 7, a data-input command "80h" is input as signal "DATA" to the memory card 10. Next, one-page data is transferred from the buffer part 211 to the memory card 10. The data transferred is stored into the memory card 10. Then, at time t1, a write command "10h" is input, as signal "DATA", to the memory card 10. In the memory card 10, the data is written in a large block contained in the semiconductor memory 11. The access control part 12 monitors the data-storage state of the semiconductor memory 11 and writes a recommended address into the recommended-address storage part 13. Assume that the semiconductor memory 11 has the data-storage state of FIG. 3 at time t2. In this case, the access control part 12 selects LBA"09h" and LBA"19h", which can be sequentially added, as recommended addresses.

At time t2, a status-read command "70h" is input, as signal "DATA", to the memory card 10. Status-reading is therefore performed to determine whether data was successfully written or not in the memory card 10. The memory card 10 that has received the status-read command outputs a status signal ST at time t3. The status signal ST indicates whether the write process has been successfully performed.

At time t4 or thereafter, a recommended address is output, as signal "DATA", from the memory card 10 to the host apparatus 20. The recommended-address storage part 13 may store LBA"09h" and LBA"19h". If so, the address-outputting part 122 outputs LBA"09h" at time t4, and LBA"19h" at time t5, to the output control part 213.

The output control part 213 selects LBA"09h" or LBA"19h" as the LBA of the small block that is to be transferred to the memory card 10. Then, the output control part 213 transfers a small block which is allocated with LBA"09h" or LBA"19h", if any in the buffer part 211, to the memory card 10. In the memory card 10, the small block allocated with LBA"09h" or the small block allocated with LBA"19h" are written into the semiconductor memory 11. As a result, no re-storing is performed in the semiconductor memory 11. This suppresses an increase in the write time, due to re-storing. However, re-storing may be necessary to be performed in the next data-writing process if the buffer part 211 stores no small blocks allocated with recommended addresses.

At time t3 when the memory card 10 outputs the status signal ST, the semiconductor memory shown in FIG. 1 can output data and the host apparatus 20 can receive any data transferred from the memory card 10. The memory card 10 can therefore output recommended addresses to the host apparatus 20 immediately after time t3, without necessity of changing the state of the semiconductor memory 11 or the state of the host apparatus 20. Thus, the entire process time can be greatly reduced if recommended addresses are output from the memory card 10 to the host apparatus 20 immediately after the status has been read.

In the aforementioned instance, the recommended addresses are LBAs that can be sequentially added to the large blocks contained in the semiconductor memory 11. That is, the access control part 12, in order to determine the recommended addresses, uses LBAs that can be sequentially added in the semiconductor memory 11 and are selected depending on the data-storage state of the memory 11 as operation information. Alternatively, the physical address (PBA) of the semiconductor memory 11, which suppresses the decrease in the speed with which new data is written immediately into the memory 11, can be used as a recommended address. Still alternatively, a PBA that allows a write process at high reliability can be used as a recommended address. Note that "PBA" is an address actually allocated to the memory, the output/input port, or the like. PBAs that can be used as recommended addresses will be exemplified.

Figure 9:
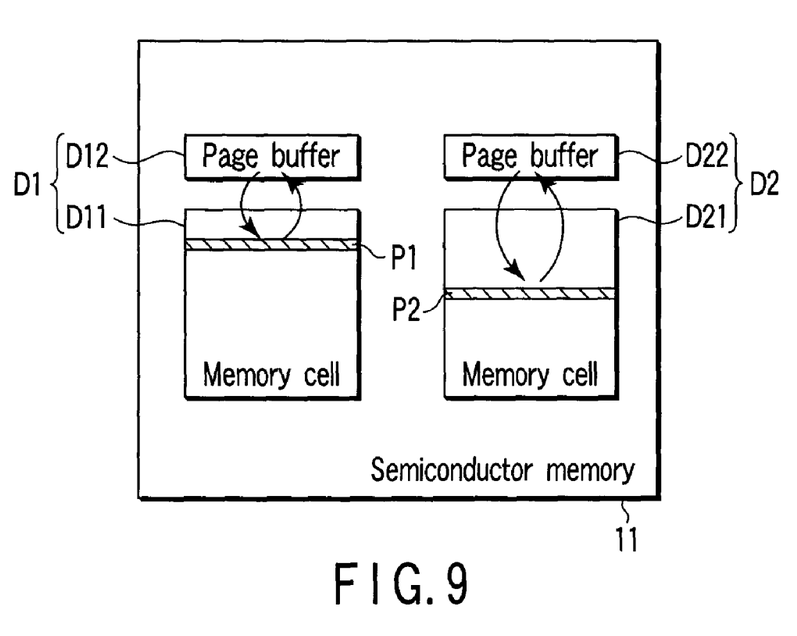
FIG. 9 is a diagram schematically showing another structure the semiconductor memory according to the first embodiment may have.

FIG. 9 shows an example of the semiconductor memory 11, which comprise a plurality of NAND-type flash memory chips. Hereinafter, the page buffer included in a memory chip and a memory cell whose pages share the page buffer will be called "district". That is, FIG. 9 illustrates a semiconductor memory that has two districts D1 and D2. The district D1 comprises a memory-cell unit D11 and a page buffer D12. The page buffer D12 stores one-page data. In the write process, data is transferred at a time from the page buffer D12 to the memory-cell unit D11. In the read process, the one-page data stored in the memory-cell unit D11 is stored at a time into the page buffer D12. Like the district D1, the district D2 comprises a memory-cell unit D21 and a page buffer D22. Pages P1 and P2 that are shaded in FIG. 9 and have been stored in the memory-cell units D11 and D21, respectively, are pages that have been read or written.

As mentioned above, the districts D1 and D2 constitute the semiconductor memory 11. The access control part 12 uses this fact as operation information about the semiconductor memory 11, thereby selecting recommended addresses. That is, the PBA of the district D1 and the PBA of the district D2, which differ from each other, are output as recommended addresses, from the memory card 10 to the output control part 213 of the host apparatus 20. Using these recommended addresses, the host apparatus 20 can access both districts D1 and D2 at the same time. The speed of accessing the semiconductor memory 11 can therefore be raised.

Another example of a PBA that can be used as a recommended address will be shown. FIGS. 10A to 10D show various states the semiconductor memory 11 may assume which includes a district D3 that comprises a memory-cell unit D31, a page buffer D32, and a data cache D33. The district D3 has a temporary-storage area for both the page buffer D32 and the data cache D33. The district D3 can therefore copy pages as will be explained below. That is, the district D3 can read the data stored in the data cache D33 and transfers it to the host apparatus 20 and can, at the same time, write the data stored in the page buffer D32, into the memory-cell unit D31. Alternatively, the district D3 can write data from the host apparatus 20 into the data cache D33 and, at the same time, write the data stored in the page buffer D32 into the memory-cell unit D31. Hence, the district D3 can copy pages at high speed.

Figure 10A:
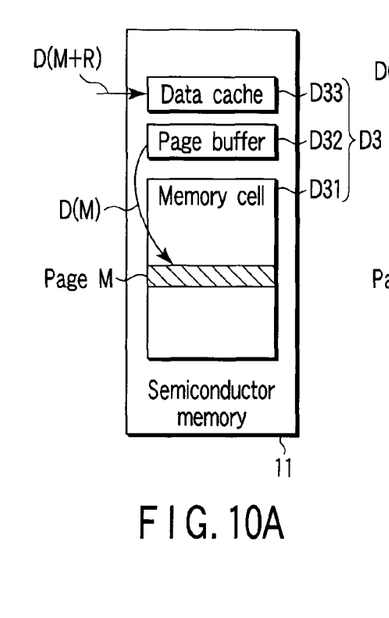
FIG. 10A illustrates the state the semiconductor memory assumes while pages are being copied in the memory card according to the first embodiment.
Figure 10B:
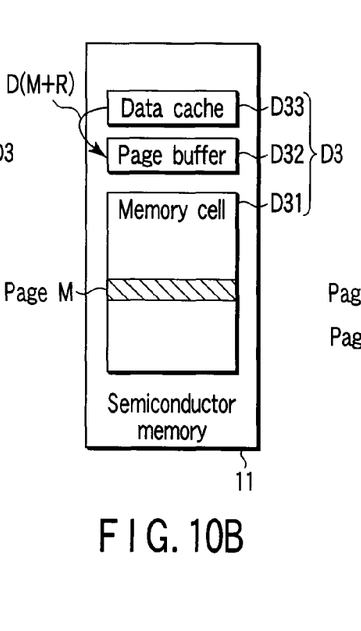
FIG. 10B illustrates the state the semiconductor memory assumes while pages are being transferred into a page buffer during the page copying performed in the memory card according to the first embodiment.
Figure 10C:
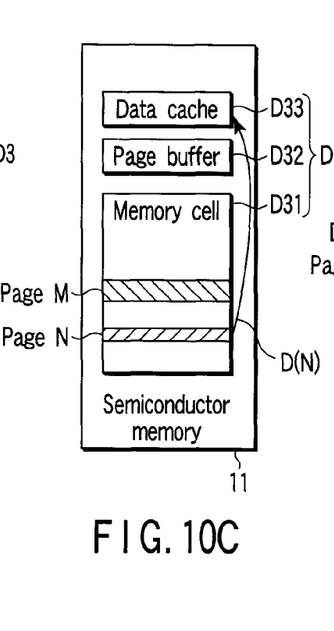
FIG. 10C illustrates the state the semiconductor memory assumes while pages are being transferred into a data cache during the page copying performed in the memory card according to the first embodiment.
Figure 10D:
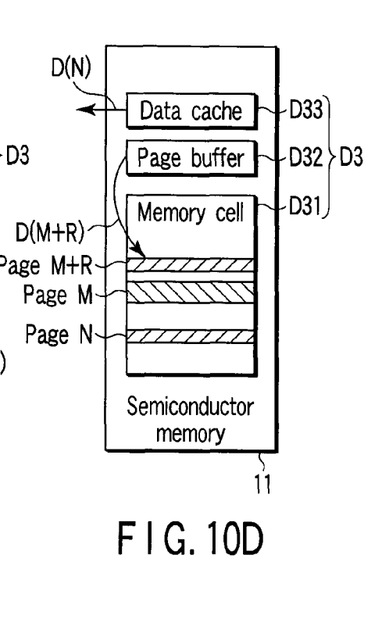
FIG. 10D illustrates the state the semiconductor memory assumes while data is being read in the memory card according to the first embodiment.

As shown in FIG. 10A, data D(M+R) to be written in page M+R, for example, is stored into the data cache D33, while the data D(M) stored in the page buffer D32 is being written in page M. Next, as shown in FIG. 10B, the data D (M+R) is transferred from the data cache D33 into the page buffer D32. Then, as shown in FIG. 10C, the data D(N) stored in page N is stored into the data cache D33. Thereafter, as shown in FIG. 10D, the data D(N) stored in the data cache D33 is read from the district D3, while the data D(M+R) stored in the page buffer D32 is being written into the page M+R. This increases the speed of accessing the district D3.

The addresses, which allows access to the district D3 using the data cache D33 shown in FIGS. 10A to 10D, generally differ depending on the type of districts utilized in the semiconductor memory 11. This is why the access control part 12 uses the fact that the memory 11 has the data cache D33 as operation information about the semiconductor memory 11 in order to select recommended addresses. That is, the addresses that can be accessed through the data cache D33 are output as recommended addresses, from the memory card 10 to the output control unit 213 of the host apparatus 20. The access speed can be thereby increased.

A description will be made on an example where the semiconductor memory 11 shown in FIG. 1 is a multi-value NAND-type flash memory and recommended addresses are used to write data into the flash memory at high speed and high reliability. In the multi-level NAND-type flash memory, a plurality of pages share one memory cell. When the multi-level NAND-type flash memory is employed as semiconductor memory 11 (FIG. 1), only one of the pages which share one memory cell may be used in the write process. This technique can not only raise the access speed, but also enhance the reliability of the written data.

Figure 11:
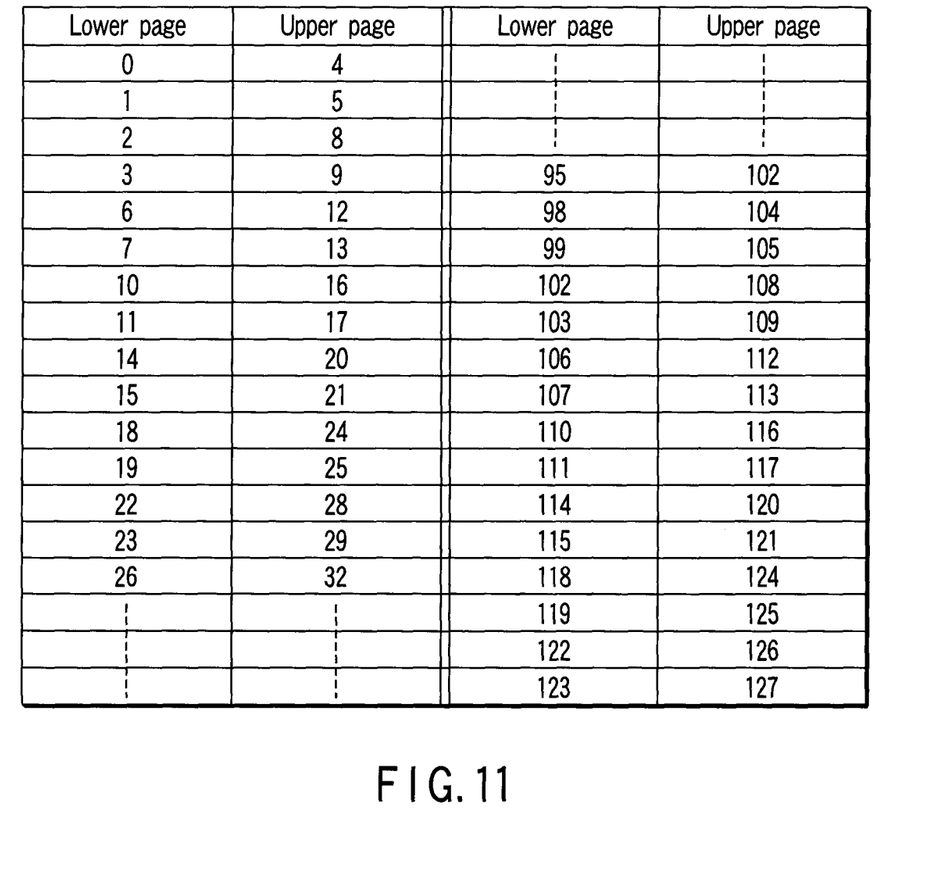
FIG. 11 is a table schematically illustrating still another structure that the semiconductor memory according to the first embodiment may have.

Assume that, as shown in FIG. 11, a lower page A and an upper page B share the memory-cell unit having pages 0 to 127. With One memory cell capable of storing two bits, a "lower page" consists of the lower bits of a page identified by one address, and an "upper page" consists of the upper bits of that page. For example, the lower page identified by the uppermost address in the left column of FIG. 11 is handled as page 0, while the upper page identified by the uppermost address in the left column is handled as page 4.

To write data in lower pages only, the address of page 6 is output as recommended address from the memory card 10 to the output control part 213 immediately after the data is written in, for example, page 3. Since page 3 and page 6 are pages that have consecutive addresses for lower pages, the data is written in the lower pages only. On the other hand, to write data in upper pages only, the address of page 12 is output as recommended address to the output control part 213 immediately after the data is written in, for example, page 9.

As described above, the access control part 12 refers to information indicative of the memory cell shared by the lower page and the upper page to select only pages classified as lower pages or upper pages as recommended address. The data are written in only the lower pages or the upper pages. This technique can realize high speed write process and high reliability.

The memory card 10 according to the first embodiment of this invention outputs to the host apparatus 20 a recommended address that can be accessed faster or more reliably than any other address in the semiconductor memory 11. The host apparatus 20 refers to the recommended address to determine which data should be accessed in the semiconductor memory 11. As a result, the host apparatus 20 can access the memory card 10 at high speed and high reliability. In other words, the memory card 10 according to the first embodiment of this invention improves the performance of the entire memory card system. Thus far, how the write process is performed is explained. The recommended address may be output from the memory card 10 to the host apparatus to be used for read process. This also improves the performance of the entire memory card system.

Second Embodiment

Figure 12:
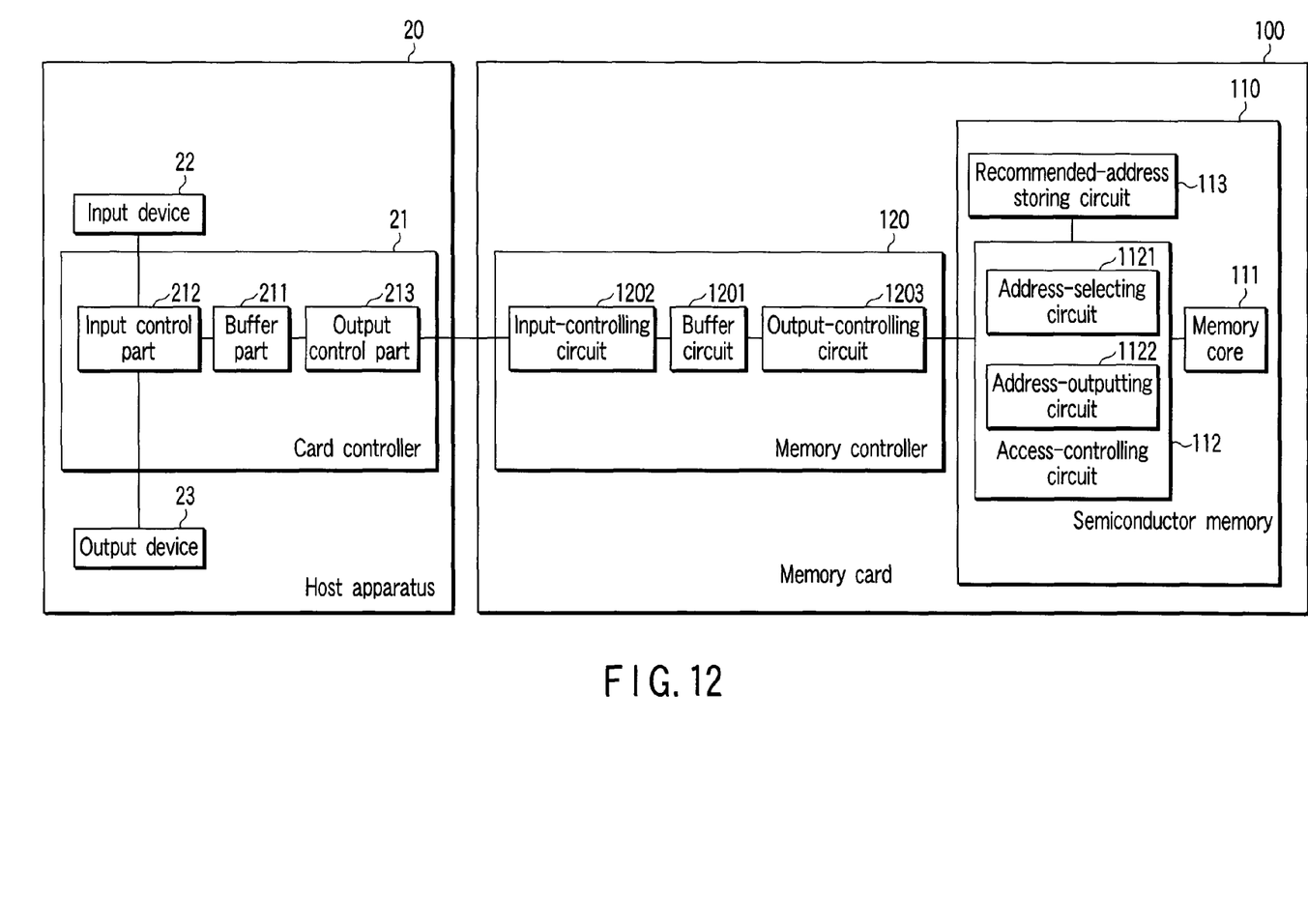
FIG. 12 schematically shows the configuration of a memory card according to a second embodiment of the present invention.

As FIG. 12 shows, a memory card 100 according to the second embodiment of the present invention comprises a semiconductor memory 110 and a memory controller 120. The memory card 100 can be coupled to a host apparatus 20. The host apparatus 20, which is shown in FIG. 12, is identical in configuration to the host apparatus 20 shown in FIG. 1.

Like the semiconductor memory 11 according to the first embodiment, the semiconductor memory 110 has its access speed changed in accordance with the address that has been accessed. The semiconductor memory 110 comprises a memory core 111, an access-controlling circuit 112, and a recommended-address storing circuit 113. The memory core 111 is constituted by, for example, districts D1 to D3 as shown in FIG. 9 or FIGS. 10A to 10D. The access-controlling circuit 112 selects recommended addresses in accordance with the operation information about the memory core 111. The access-controlling circuit 112 comprises an address-selecting circuit 1121 and an address-outputting circuit 1122. The address-selecting circuit 1121 monitors the data-storage state of the memory core 111 and selects recommended addresses the host apparatus 20 will use to access the semiconductor memory 100. The address-outputting circuit 1122 outputs the recommended addresses, thus selected, to the memory controller 120. The recommended-address storing circuit 113 stores the recommended address the access-controlling circuit 112 has selected.

The memory controller 120 comprises a buffer circuit 1201, an input-controlling circuit 1202, and an output-controlling circuit 1203. The buffer circuit 1201 stores the data transferred from the host apparatus 20 to the memory card 100 and the data read from the semiconductor memory 110. The input-controlling circuit 1202 controls the data transfer between the host apparatus 20 and the buffer circuit 1201. The output-controlling circuit 1203 controls the data transfer between the semiconductor memory 110 and the buffer circuit 1201. Further, the output-controlling circuit 1203 selects the data that is stored in the buffer circuit 1201 and should be stored into the semiconductor memory 110 in accordance with the recommended address transferred from the access-controlling circuit 112.

As indicated above, the semiconductor memory 110 shown in FIG. 12 can select and output recommended addresses, as the memory card 10 according to the first embodiment. The memory controller 120 shown in FIG. 12 can select the address of the data to be written into the semiconductor memory 110, in accordance with a recommended address like the host apparatus 20. In other words, the semiconductor memory 110 shown in FIG. 12 outputs to the memory controller 120 a recommended address that can be accessed faster and more reliably than any other address when the recommended address are selected. The memory card 100 refers to the recommended addresses to select the data to be written into the semiconductor memory 110 among the data items stored in the buffer circuit 1201. As a result, the host apparatus 20 can access the memory card 100 at high speed and high reliability.

Using recommended addresses, the host apparatus 20 can access the memory card 100 shown in FIG. 12 even if it does not have the card controller 21 shown in FIG. 12. The second embodiment is essentially identical to the first embodiment in any other features (including some examples of recommended addresses). Therefore, the other features of the second embodiment will not be described.

The present invention has been described with reference to the first and second embodiments. Nevertheless, it should not be understood that the above description and the accompanying drawings, which constitute a part of this disclosure, limit the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A memory system, comprising:
a semiconductor memory, having storage areas identified by physical addresses, configured to store data in each of the storage areas and configured to perform data write processing in accordance with a data write request; and
an access-controlling unit including
an address-determining unit configured to determine at least one recommended address to be used in a next data write request to the semiconductor memory based on operation information,
a recommended-address storage unit configured to store the at least one recommended address which is determined by the address-determining unit, and
an address outputting unit configured to output the recommended address which is stored in the recommended-address storage unit to outside the memory system, wherein
time consumed in data write processing with the recommended address is shorter than time consumed in data write processing without the recommended address in the semiconductor memory.

2. The memory system according to claim 1, wherein the address outputting unit
outputs a status signal representing success or failure of the data write processing in the semiconductor memory, and
outputs the recommended address immediately after outputting the status signal.

3. The memory system according to claim 1, wherein
the data is allocated with a specific logical address, and
the recommended address includes a logical address next to the specific logical address allocated to the data stored in a storage area that precedes consecutive vacant storage areas.

4. The memory system according to claim 1, wherein
the semiconductor memory includes a first semiconductor memory chip and a second semiconductor memory chip, the first semiconductor memory chip has storage areas and a buffer area configured to temporarily store data transferred between the buffer area and the storage areas in the first semiconductor memory chip, the second semiconductor memory chip has storage areas and a buffer area configured to temporarily store data transferred between the buffer area and the storage areas in the second semiconductor chip, and the recommended address includes a physical address of one of the storage areas in the first semiconductor memory chip and a physical address of one of the storage areas in the second semiconductor memory chip.

5. The memory system according to claim 1, wherein the storage areas include first storage areas and second storage areas, the semiconductor memory includes a data cache configured to store data, the data cache being inhibited from transferring data to and from the first storage areas, the data cache being allowed to transfer data to and from the second storage areas, and the recommended address is selected from the second storage areas.

6. The memory system according to claim 1, wherein each of the storage areas includes memory cells, each memory cell being configured to store data at a first bit and data at a second bit, an address is allocated to each of first bit groups each including only first bits and to each of second bit groups each including only second bits, and for a data write after a last data write into one of the first bit groups, another one of the first bit groups other than a last-written one of the first bit groups being designated as the recommended address.

7. A memory system, comprising:

a semiconductor memory having storage areas identified by physical addresses, configured to store data in each of the storage areas and configured to perform data write processing in accordance with a data write request;

an access controlling unit including an address-determining unit configured to determine at least one recommended address to be used in a next data write request to the semiconductor memory based on operation information, a recommended-address storage unit configured to store the at least one recommended address which is determined by the address-determining unit, and an address outputting unit configured to output the recommended address which is stored in the recommended-address storage unit to outside the memory system; and a controller configured to receive write data, configured to temporarily store the write data, configured to receive the recommended address, and configured to output the write data which has the recommended address to the semiconductor memory, wherein time consumed in data write processing with the recommended address is shorter than time consumed in data write processing without the recommended address in the semiconductor memory.

8. The memory system according to claim 7, wherein the address outputting unit outputs a status signal representing success or failure of the data write processing in the semiconductor memory, and outputs the recommended address immediately after outputting the status signal.

9. The memory system according to claim 7, wherein the data is allocated with a specific logical address, and the recommended address includes the logical address next to the logical address allocated to the data stored in the storage area that precedes consecutive vacant storage areas.

10. The memory system according to claim 7, wherein the semiconductor memory includes a first semiconductor memory chip and a second semiconductor memory chip, the first semiconductor memory chip has storage areas and a buffer area configured to temporarily store data transferred between the buffer area and the storage areas in the first semiconductor memory chip, the second semiconductor memory chip has storage areas and a buffer area configured to temporarily store data transferred between the buffer area and the storage areas in the second semiconductor chip, and the recommended address includes a physical address of one of the storage areas in the first semiconductor memory chip and a physical address of one of the storage areas in the second semiconductor memory chip.

11. The memory system according to claim 7, wherein the storage areas include first storage areas and second storage areas, the semiconductor memory includes a data cache configured to store data, the data cache being inhibited from transferring data to and from the first storage areas, the data cache being allowed to transfer data to and from the second storage areas, and the recommended address is selected from the second storage areas.

12. The memory system according to claim 7, wherein each of the storage areas includes memory cells, each configured to store data at a first bit and data at a second bit, an address is allocated to each of first bit groups each including only first bits and to each of second bit groups each including only second bits, and for a data write after a last data write into one of the first bit groups, another one of the first bit groups other than a last-written one of the first bit groups is designated as the recommended address.

13. A method of controlling a memory system which has a semiconductor memory having storage areas identified by physical addresses, the semiconductor memory storing data in each of the storage areas, and performing data write processing in accordance with a write data request, the method comprising:

determining at least one recommended address to be used in a next data write request to the semiconductor memory based on operation information;

storing the at least one recommended address in a recommended-address storage unit of the memory system;

outputting the recommended address which is stored in the recommended-address storage unit to outside the memory system; and instructing the semiconductor memory to perform the data write processing in the storage areas associated with the recommended address, wherein time consumed in data write processing with the recommended address is shorter than time consumed in data write processing without the recommended address in the semiconductor memory.

14. The method according to claim 13, wherein the outputting of the recommended address is performed immediately after outputting a status signal representing success or failure of the data write processing in the semiconductor memory.

15. The method according to claim 13, wherein
the data is allocated with a specific logical address, and
the recommended address includes a logical address next to the specific logical address allocated to the data stored in a storage area that precedes consecutive vacant storage areas.

16. The method according to claim 13, wherein
the semiconductor memory includes a first semiconductor memory chip and a second semiconductor memory chip,
the first semiconductor memory chip has storage areas and a buffer area configured to temporarily store data transferred between the buffer area and the storage areas in the first semiconductor memory chip,
the second semiconductor memory chip has storage areas and a buffer area configured to temporarily store data transferred between the buffer area and the storage areas in the second semiconductor chip, and
the recommended address includes a physical address of one of the storage areas in the first semiconductor memory chip and a physical address of one of the storage areas in the second semiconductor memory chip.

17. The method according to claim 13, wherein
the storage areas include first storage areas and second storage areas,
the semiconductor memory includes a data cache configured to store data, the data cache being inhibited from transferring data to and from the first storage areas, the data cache being allowed to transfer data to and from the second storage areas, and
the recommended address is selected from the second storage areas.

18. The method according to claim 13, wherein
each of the storage areas includes memory cells, each configured to store data at a first bit and data at a second bit,
an address is allocated to each of first bit groups each including only first bits and to each of second bit groups each including only second bits, and
for a data write after a last data write into one of the first bit groups, another one of the first bit groups other than a last-written one of the first bit groups is designated as the recommended address.

* * * * *